United States Patent
Shieh et al.

(10) Patent No.: US 9,401,431 B2
(45) Date of Patent: Jul. 26, 2016

(54) DOUBLE SELF-ALIGNED METAL OXIDE TFT

(75) Inventors: Chan-Long Shieh, Paradise Valley, AZ (US); Gang Yu, Santa Barbara, CA (US)

(73) Assignee: CBRITE INC., Goleta, CA (US)

( * ) Notice: Subject to any disclaimer, the term of this patent is extended or adjusted under 35 U.S.C. 154(b) by 0 days.

(21) Appl. No.: 13/366,503

(22) Filed: Feb. 6, 2012

(65) Prior Publication Data
US 2012/0300147 A1 Nov. 29, 2012
US 2015/0102335 A9 Apr. 16, 2015

Related U.S. Application Data

(63) Continuation-in-part of application No. 13/116,292, filed on May 26, 2011, now Pat. No. 8,129,720, which is a continuation of application No. 12/427,200, filed on Apr. 21, 2009, now Pat. No. 7,977,151.

(51) Int. Cl.
*H01L 21/04* (2006.01)
*H01L 21/02* (2006.01)
*H01L 27/12* (2006.01)
*H01L 29/786* (2006.01)
(Continued)

(52) U.S. Cl.
CPC ........ *H01L 29/7869* (2013.01); *H01L 27/1225* (2013.01); *H01L 27/1259* (2013.01); *H01L 29/45* (2013.01); *H01L 29/66969* (2013.01); *H01L 29/78606* (2013.01); *H01L 21/02554* (2013.01); *H01L 21/02565* (2013.01)

(58) Field of Classification Search
None
See application file for complete search history.

(56) References Cited

U.S. PATENT DOCUMENTS 4,888,632 A * 12/1989 Haller ................. H01L 21/0274
257/60
5,793,072 A * 8/1998 Kuo ..................... H01L 29/6675
257/241

(Continued)

FOREIGN PATENT DOCUMENTS

JP         EP 0449404 A1 * 10/1991 .......... H01L 21/0274
KR         DE 4344897 B4 * 11/2005 ................. G03F 7/00

OTHER PUBLICATIONS

Mourey, D.A.; Zhao, D.A.; Jackson, T.N., "Self-Aligned-Gate ZnO TFT Circuits," Electron Device Letters, IEEE , vol. 31, No. 4, pp. 326,328, Apr. 2010.*

(Continued)

*Primary Examiner* — Joseph Schoenholtz
(74) *Attorney, Agent, or Firm* — Robert A. Parsons; Michael W. Goltry; Parsons & Goltry

(57) ABSTRACT

A method of fabricating metal oxide TFTs on transparent substrates includes the steps of positioning an opaque gate metal area on the front surface of the substrate, depositing transparent gate dielectric and transparent metal oxide semiconductor layers overlying the gate metal and a surrounding area, depositing transparent passivation material on the semiconductor material, depositing photoresist on the passivation material, exposing and developing the photoresist to remove exposed portions, etching the passivation material to leave a passivation area defining a channel area, depositing transparent conductive material over the passivation area, depositing photoresist over the conductive material, exposing and developing the photoresist to remove unexposed portions, and etching the conductive material to leave source and drain areas on opposed sides of the channel area.

1 Claim, 3 Drawing Sheets

(51) Int. Cl.
*H01L 29/66* (2006.01)
*H01L 29/45* (2006.01)

(56) References Cited

U.S. PATENT DOCUMENTS

| | | | | |
|---|---|---|---|---|
| 6,403,408 | B1* | 6/2002 | Green et al. | 438/161 |
| 7,923,311 | B2* | 4/2011 | Zhang et al. | 438/151 |
| 8,187,929 | B2* | 5/2012 | Shieh et al. | 438/158 |
| 8,883,554 | B2* | 11/2014 | Sakata | H01L 29/7869 257/43 |
| 2006/0284171 | A1* | 12/2006 | Levy | B82Y 10/00 257/43 |
| 2007/0278498 | A1* | 12/2007 | Nakamura | H05B 33/145 257/79 |
| 2008/0044962 | A1* | 2/2008 | Zhang et al. | 438/159 |
| 2010/0244017 | A1* | 9/2010 | Hoffman | H01L 29/78696 257/43 |
| 2011/0037054 | A1* | 2/2011 | Shieh et al. | 257/40 |
| 2011/0104841 | A1* | 5/2011 | Shieh et al. | 438/34 |
| 2012/0104381 | A1* | 5/2012 | Shieh et al. | 257/43 |
| 2012/0182284 | A1* | 7/2012 | Shieh et al. | 345/214 |
| 2012/0218241 | A1* | 8/2012 | Shieh et al. | 345/211 |
| 2012/0313092 | A1* | 12/2012 | Shieh et al. | 257/43 |

OTHER PUBLICATIONS

Nomura, Kenji, Akihiro Takagi, Toshio Kamiya, Hiromichi Ohta, Masahiro Hirano, and Hideo Hosono. "Amorphous Oxide Semiconductors for High-Performance Flexible Thin-Film Transistors." Japanese Journal of Applied Physics 45.No. 5B (2006): 4303-308.*
Chen, Charlene. Amorphous In—Ga—Zn—O Thin Film Transistors for Active Matrix Organic Light Emitting Displays. Thesis. University of Michigan, 2010. Ann Arbor: University of Michigan, 2010.*
S. Jeon, S. Park, I. Song, J. H. Hur, J. Park, S. Kim, S. Kim, H. Yin, E. Lee, S. Ahn, H. Kim, C. Kim, and U. I. Chung, "180 nm gate length amorphous InGaZnO thin film transistor for high density image sensor applications," in IEDM Tech. Dig., 2010, pp. 21.3.1-21.3.4.*
Kim, Cheol-Se, Byung Koo Kang, Ji Hyun Jung, Min Jae Lee, Hun Bae Kim, Seung Seok Oh, Su Hyuk Jang, Hwan Joo Lee, Hiraki Kastuyoshi, and Jong Keun Shin. "Active Matrix Touch Sensor Perceiving Liquid Crystal Capacitance with Amorphous Silicon Thin Film Transistors." Japanese Journal of Applied Physics 49.3 (2010): 03CC03.*
Nathan, A., Lee, S., Jeon, S., Song, I. and Chung, U.-I. (2012), 3.1: Invited Paper: Amorphous Oxide TFTs: Progress and Issues. SID Symposium Digest of Technical Papers, 43:1-4.*
Park, Young-Ju, et.al., Embedded Touch Sensing Circuit using Mutal Capacitance for Active Matrix Organic Light Emitting Diode Display, Japanese Journal of Applied Physics, vol. 50, Issue 3, pp. 03CC08-03CC08-5 (2011).*
Kanda, Eiji, et. al. Integrated Active Matrix Capacitive Sensors for Touch Panel LTPS-TFT LCDs, SID Symposium Digest of Technical Papers, 39 (1) 2008 pp. 834-837.*
Laegler Diane, Lumex TFT LCD Technology, Aug. 19, 2010 downloaded from URL<www.lumex/images/lumex_tftlcdtechnology_ptm.ppt> on Mar. 25, 2013.*
I-Chun Cheng, A.Z. Kattamis, K. Long, J.C. Sturm, and S. Wagner. "Self-aligned Amorphous-silicon TFTs on Clear Plastic Substrates." IEEE Electron Device Letters 27.3 (2006): 166-68.*
Geng, Di, Han Kang, and Jin Jang. "High Performance Amorphous Indicum—Gallium—Zinc—Oxide Thin-Film Transistor with a Self-Alighed Etch Stopper Patterned by Back-Side UV Exposure." IEEE Electron Device Letters 32.6 (2011): 758-60. published Apr. 20, 2011.*
of Chen, Charlene, Amorphous In—Ga—Zn—O Thin Film Transistors for Active Matrix Organic Light Emitting Displays. Thesis. University of Michigan, 2010. Ann Arbor: University of Michigan, 2010.*
Cherenack, K. H.; Hekmatshoar, B.; Sturm, J.C.; Wagner, S., "Self-Aligned Amorphous Silicon Thin-Film Transistors Fabricated on Clear Plastic at 300 ," Electron Devices, IEEE Transactions on , vol. 57, No. 10, pp. 2381,2389, Oct. 2010.*
Geng, Di, Han Kang, and Jin Jang. "High Performance Amorphous Indicum—Gallium—Zinc—Oxide Thin-Film Transistor with a Self-Alighed Etch Stopper Patterned by Back-Side UV Exposure." IEEE Electron Device Letters 32.6 (2011): 758-60.*
Munzenrieder, Niko, Pascal Voser, Luisa Petti, Christoph Zysset, Lars Buthe, Christian Vogt, Giovanni A. Salvatore, and Gerhard Troster. "Flexible Self-Aligned Double-Gate IGZO TFT." IEEE Electron Device Letters 35.1 (2014): 69-71.*
Jeon, S., S. Park, I. Song, J. H. Hur, J. Park, S. Kim, S. Kim, H. Yin, E. Lee, S. Ahn, H. Kim, C. Kim, and U. I. Chung, "180 nm gate length amorphous InGaZnO thin film transistor for high density image sensor applications", IEDM Tech. Dig., 2010, pp. 21.3.1-21.3.4.*
Reyes P I, Ku C J, Duan Z, Lu Y, Solanki A and Lee K B 2011 Appl. Phys. Lett. 98 173702.*
Chen, Charlene, Amorphous In—Ga—Zn—O Thin Film Transistors for Active Matrix Organic Light Emitting Displays. Thesis. University of Michigan, 2010. Ann Arbor: University of Michigan, 2010.*
Kamiya, Toshio, Kenji Nomura, and Hideo Hosono. "Present Status of Amorphous In—Ga—Zn—O Thin-film Transistors." Science and Technology of Advanced Materials 11.4 (2010): 044305.*
Nomura, Kenji, Hiromichi Ohta, Akihiro Takagi, Toshio Kamiya, Masahiro Hirano, and Hideo Hosono. "Room-temperature Fabrication of Transparent Flexible Thin-film Transistors Using Amorphous Oxide Semiconductors." Nature 432.7016 (2004): 488-92.*
C. S. Yang , W. W. Read , C. B. Arthur and G. N. Parsons "Comparison of conventional and self-aligned a-Si:H thin film transistors", Flat Panel Display Materials III, vol. 471, pp. 179-184 1997.*
Takagi, Akihiro, Kenji Nomura, Hiromichi Ohta, Hiroshi Yanagi, Toshio Kamiya, Masahiro Hirano, and Hideo Hosono. "Carrier Transport and Electronic Structure in Amorphous Oxide Semiconductor, A-InGaZnO4." Thin Solid Films 486.1-2 (2005): 38-41.*
Hekmatshoar, B., et. al. "Self-alignment techniques for fabricating a-Si:H TFTs at 300 C on clear plastic" Proceedings of the 5th International TFT Conference, (ITC 2009), Palaiseau, France, Mar. 5-6, 2009.*
Kanda, Eiji, et. al., Integrated Active Matrix Capacitive Sensors for Touch Panel LTPS-TFT LCDs, SID Symposium Digest of Technical Papers, 39 (1) 2008 pp. 834-837.*
Vishakha O Gupta. Article: A Survey on Stunning IGZO Technology. IJAIS Proceedings on National Level Technical Conference X-PLORE 2013 XPLORE: Mar. 1-3, 2013.*
Cheng, I-Chun, A.Z. Kattamis, K. Long, J.c. Sturm, and S. Wagner. "Self-aligned Amorphous-silicon TFTs on Clear Plastic Substrates." IEEE Electron Device Letters 27.3 (2006): 166-68.*
Chuang, Chiao-Shun, Tze-Ching Fung, Barry G. Mullins, Kenji Nomura, Toshio Kamiya, Han-Ping David Shieh, Hideo Hosono, and Jerzy Kanicki. "P-13: Photosensitivity of Amorphous IGZO TFTs for Active-Matrix Flat-Panel Displays." SID Symposium Digest of Technical Papers 39.1 (2008): 1215.*

* cited by examiner

DOUBLE SELF-ALIGNED METAL OXIDE TFT

CROSS-REFERENCE TO RELATED APPLICATIONS

This application is a continuation-in-part application of U.S. application Ser. No. 13/116,292, filed 26 May 2011, now issued as U.S. Pat. No. 8,129,720, which was a continuation application of U.S. application Ser. No. 12/427,200, filed 21 Apr. 2009 now issued as U.S. Pat. No. 7,977,151.

FIELD OF THE INVENTION

This invention generally relates to a double self-alignment fabrication of metal oxide TFTs to remove critical alignment tools.

BACKGROUND OF THE INVENTION

Metal oxide thin film transistors (MOTFT) are gaining interest as high performance TFT backplanes for large area applications such as active matrix organic light emitting diodes (AMOLED). See for example U.S. Pat. No. 7,977,868 entitled "Active Matrix Light Emitting Display" issued on 12 Jul. 2011, and incorporated herein by reference. Many of these large area applications use either glass or plastic substrates. To produce TFTs on large areas at low cost, it is advantageous to use low cost lithographic tools such as proximity/projection aligners rather than the more expensive stepper tools. Furthermore, due to deformation of substrates in processing (either glass due to high temperature treatment or plastic substrates due to chemical and heat treatment), the alignment issue has to be solved. Typically, misalignment due to deformation increases with the size of the exposure field. One way to compensate for the deformation is to reduce the exposure field by performing multiple exposures on the substrate and then stitching the multiple patterns together. However, this process substantially increases the manufacturing cost due to lower through put and the high cost of stitching.

It would be highly advantageous to have a self-aligned process in which there are no critical alignment steps.

Accordingly, it is an object of the present invention to provide new and improved methods of fabricating self-aligned metal oxide TFTs.

It is another object of the present invention to provide new and improved methods of fabricating metal oxide TFTs including no critical alignment tools or steps and using a minimum of process steps.

SUMMARY OF THE INVENTION

Briefly, to achieve the desired objects of the instant invention in accordance with a preferred embodiment thereof, provided is a method of fabricating metal oxide TFTs on transparent substrates using double self-alignment steps. The method includes a step of providing a transparent substrate, either flexible or rigid, having a front surface and a rear surface, and positioning opaque gate metal on the front surface of the substrate to define a gate area for a TFT. A layer of transparent gate dielectric is deposited on the front surface of the substrate overlying the gate metal and a surrounding area and a layer of transparent metal oxide semiconductor material is deposited on the surface of the layer of transparent gate dielectric. Passivation material is then positioned on the layer of metal oxide semiconductor material by either a subtractive or an additive process to leave a passivation area defining a channel area for the TFT overlying the gate area. In the subtractive process some of the steps include depositing a layer of first positive working photoresist over the layer of a transparent passivation material overlying the gate metal and the surrounding area, exposing portions of the layer of first photoresist from the rear surface of the substrate and developing the layer of first photoresist to remove exposed portions of the layer of first photoresist to form an etch mask, and removing portions of the layer of passivation material and removing the etch mask. In the additive process the passivation layer is exposed directly, with exposed portions removed and unexposed portions remaining. A layer of transparent conductive material is then formed over the passivation area by one of subtractive and additive processes to leave source and drain areas on opposed sides of the channel area. The subtractive process includes the steps of depositing a layer of second negative working photoresist over the layer of transparent conductive material, exposing portions of the layer of second photoresist from the rear surface of the substrate and developing the layer of second photoresist to remove unexposed portions of the layer of second photoresist to form an etch mask, and removing portions of the layer of transparent conductive material by etching or the like. It will be understood that the transparent conductive material can include metal oxide, a thin layer of metal, etc. or in some special applications a transparent layer of organic material. The additive process includes selectively depositing the conductive material directly.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF A PREFERRED EMBODIMENT

Figure 4:
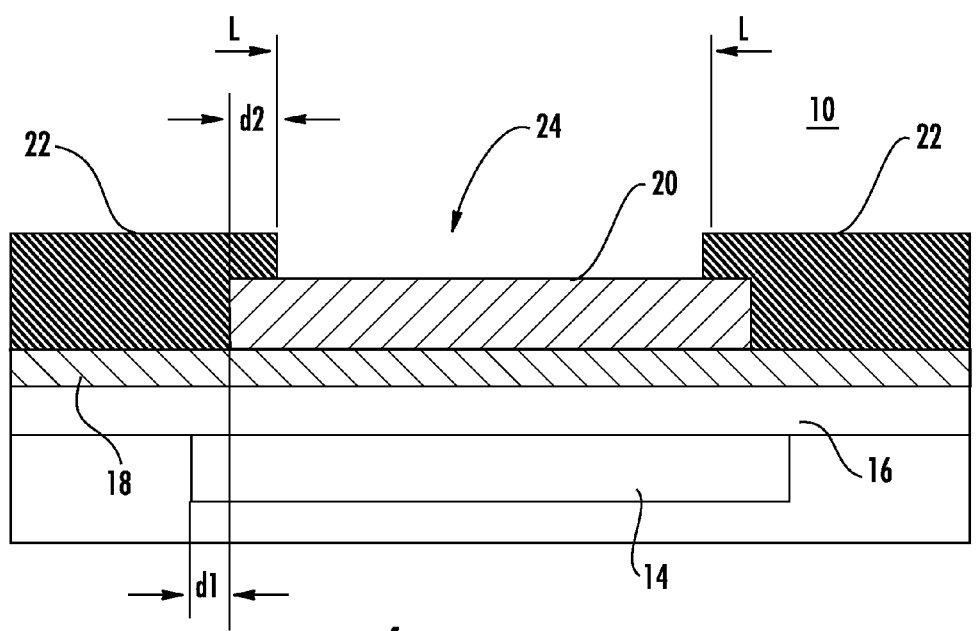
FIG. 4 illustrates an enlarged final stage or phase in the fabrication of TFTs in accordance with the present invention.

Turning now to the drawings, attention is first directed to FIG. 4, for the purpose of briefly explaining prior art problems. The device illustrated in FIG. 4 is a bottom gate and top source/drain metal oxide TFT, designated 10. TFT 10 includes a substrate 12 with gate metal 14 patterned thereon. A gate dielectric layer 16 is deposited over gate metal 14 and a semiconductor active layer 18 is deposited over dielectric layer 16 so as to insulate active layer 18 from gate metal 14. A passivation area 20 is patterned on active layer 18 and source/drain areas 22 are formed on opposite sides of passivation area 20 on the upper surface of active layer 18. The space between the source and drain defines the conduction channel, designated 24, for TFT 10.

In the prior art process of fabricating TFT 10, two critical alignment steps are prevalent. The first critical alignment step is between passivation area 20 (channel protection layer) and gate metal 14. Gate metal 14 should be slightly larger than passivation area 20, indicated as overlap area d1 where d1>0. The second critical alignment is between the pattern for source/drain 22 and passivation area 20. There should be a slight overlap between source/drain areas 22 and passivation area 20, indicated as overlap area d2 where d2>0, so that the etching of the source/drain conductor in the formation of source/drain areas 22 (i.e. the channel space between source/drain 22) will not affect active layer 18. That is the possibility that an etchant can pass around the edges of passivation area 20 and reach active layer 18 is prevented by overlap d2. It will be understood that any alignment patterning includes some tolerance and that the fabrication process includes some deformation tolerance.

Therefore to make a channel length of L (generally the horizontal width of passivation area 20), the distance between the source and drain should be smaller than (L-2×d2). In this relationship or description of L, d2 includes any alignment and deformation tolerance. Further, horizontal width of gate metal 14 should be larger than (L+2×d1). In this relationship or description of L, d1 includes any alignment and deformation tolerance. Thus, the value of overlaps d1 and d2 depends on the alignment tool (i.e. the alignment tolerance) and the amount of substrate deformation during the fabrication process. For low cost tools, overlaps d1 and d2 are relative large, around 5 microns without the added contribution from substrate deformation. For 10 ppm substrate deformation, a field size of 50 cm can contribute another 5 microns to the tolerance. It is desirable at present to fabricate TFTs with channel lengths as small, or smaller, than 10 microns. However, using the prior art fabrication methods described above with low cost tools and large field sizes, forming a channel length of 10 microns is not possible, or alternatively a source/drain spacing of 10 microns, will result in L equaling 30 microns because of the alignment/deformation tolerances included in overlaps d1 and d2.

Figure 1:
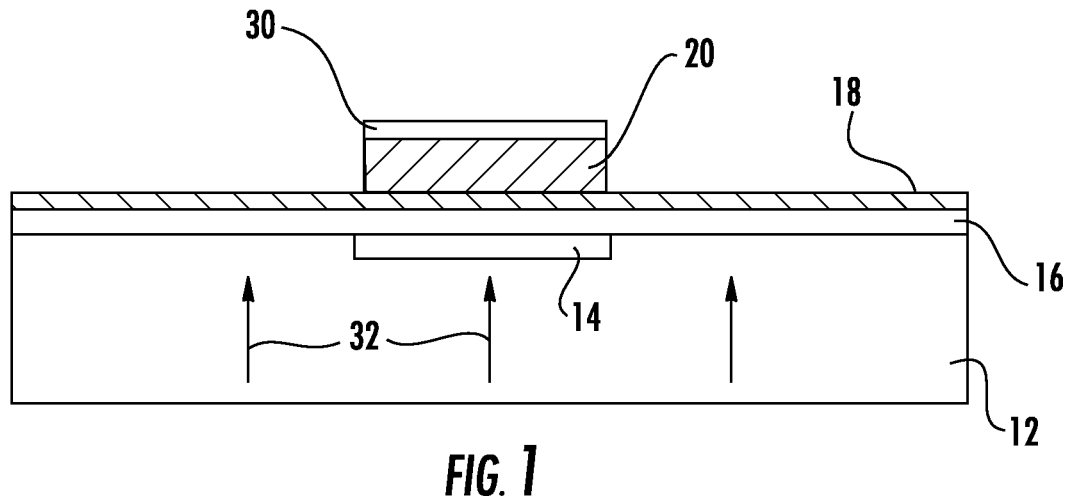
FIG. 1 illustrates a first stage or phase in the fabrication of TFTs in accordance with the present invention.

To understand the double self-alignment procedure of the present invention, FIGS. 1 through 4 illustrate sequential steps in an embodiment fabricated in accordance with the present invention. Turning specifically to FIG. 1, a transparent substrate 12 is illustrated, which may be any convenient material transparent to radiation (i.e. self-alignment exposure) wavelength used in the self-alignment procedure, such as glass, plastic, etc. Throughout this disclosure the terms "transparent" and "opaque" mean that the material being discussed or described is transparent or opaque to radiation (i.e. exposure) wavelengths used in the self-alignment procedure. Gate metal layer 14 is patterned on the upper surface of substrate 12 by any convenient means. Since the position of gate metal layer 14 is not critical virtually any non-critical patterning technique can be used.

It will be understood by those of skill in the art that in addition to or instead of forming gate metal layer 14 with a proximity or a projection tool, the gate layer can be formed with any of the various printing processes mentioned above, including imprinting or off-set printing methods. Also, gate metal 14 is an opaque conductive metal that will not transmit the radiation wavelengths used in the self-alignment procedure. While a single gate metal 14 is illustrated for convenience in understanding, it will be understood that this might represent one or more (even all) of the TFTs used in a backplane or other large area applications.

A thin layer 16 of gate dielectric material is formed over gate metal 14 and the surrounding area. For purposes of this disclosure the term "surrounding area" includes at least the area illustrated in the figures (i.e. the gate and channel areas and the source/drain areas). Again, layer 16 may be a blanket layer covering the entire large area application and no alignment is required. The gate dielectric material may be any convenient material that provides the desired dielectric constant for TFT operation and is transparent to the radiation wavelengths used in the self-alignment procedure. Examples of the thin gate dielectric layer include SiN, SiO2, Al2O3, SrO, Ta2O5, V2O5, HfO2, TiO2 in either single layer, multiple layer or blend forms. A layer 18 of semiconductor metal oxide is deposited over the upper surface of layer 16. Metal oxide layer 18 is transparent to the radiation wavelengths used in the self-alignment procedure. Some typical examples of transparent metal oxides include ZnO, In2O3, SnO2, CdO, MgO, or their combinations such as AlZnO, ZnInO, InAlZnO, InAlSnO, InSiZnO, InSiSnO, InGaZnO, InSnO, ZnSnO, GaSnO, InGaSnO, InGaCuO, InCuO, AlCuO, InMgO, InCdO, InCdZnO, InMgZnO etc. As explained in the above described patent, the metal oxide semiconductor may be amorphous or polycrystalline, however, amorphous or nanocrystalline films with grain size significantly smaller than the channel length is preferred. Layer 18 may be a blanket layer or it may optionally be patterned, depending primarily on the final product.

A passivation layer transparent to the radiation wavelengths used in the self-alignment procedure is then deposited over layer 18. Preferably, the constraint on the passivation layer is that the passivation layer should have very little chemical interaction with the underlying semiconductor metal oxide layer 18. For examples and explanations of this feature see U.S. Pat. No. 7,812,346, entitled "Metal Oxide TFT with Improved Carrier Mobility", issued on 12 Oct. 2010, and incorporated herein by reference. Examples of passivation material that can be processed by a wet coating process (such as spin coating, slot coating, spray coating, etc.) or printing process include polymer PMGI, polystyrene, PMMA, polyimide, polyvinylene alcohol (PVA), Polyethylene, polysilane and spin on glass. Examples of passivation material that can be processed by vacuum deposition (such as thermal evaporation or sputter) include $MgF_2$, Ta2O5, V2O5, HfO, W2O5, SrO, SrTiO3, MgO, Al2O3, $SiO_2$, SiN etc. The passivation layer can be in the form of single layer, bi-layer, multiple layers or in a mixture/blend form.

Once the passivation layer is deposited, a positive working photoresist layer 30 is positioned thereon, for example by spin coating, slot coating, spray coating, or the like. Photoresist layer 30 is then exposed from the back (rear surface, below substrate 12 in FIG. 1, represented by arrows 32). Since all of the materials except the gate metal are transparent to the exposing light, gate metal 14 will act as a mask for the alignment of the passivation area 20. Thus, photoresist layer 30 is exposed and developed to form a mask for the etching of the passivation layer into passivation area 20 overlying gate metal 14. As illustrated in FIG. 1, all exposed portions of photoresist layer 33 are removed because the exposed portions of the positive photoresist decompose or disassociate (change relative to the unexposed portion) to allow the exposed areas to be relatively easily removed in the developing stage. The passivation material over the exposed areas can be etched away using the first photoresist as a mask, generally with a light etchant or other dissolving material, with no effect on the lower surface.

In an alternative process, the passivation layer can include a patternable material, such as the positive working photoresist, PMGI (MicroChem Co.), Photopatternable polyimide or poly-acrylics (Toray SL-4100, Torey DL-1603, HD Microsystem PI-2500 series, etc.), insulating nano-particles embedded in the positive working photo polymer, etc. UV decomposable paintings known to experts in the painting industry can also be used for forming passivation layer 20. In this alternative process the passivation layer is exposed and developed so that only the passivation layer 20 remains overlying gate metal 14. It should be noted that in this specific process the passivation layer does not need to be transparent since the passivation layer is exposed rather than a photoresist layer on the upper surface. Regardless which method or process for patterning passivation area 20 is used, the method should not destroy or adversely affect semiconductor active layer 18. Some extra mask pattern may be needed or used to pattern other parts of the product outside of TFT 10 and the critical gate area. A description of such parts of the product outside of TFT 10 is provided in U.S. Pat. No. 7,605,026, entitled "Self-Aligned Transparent Metal Oxide TFT on Flexible Substrate", issued on 20 Oct. 2009, and incorporated herein by reference. The pattern in such non-critical areas can also be formed by one of several printing methods (such as imprinting, inkjet printing, solution dispensing, etc.) known to artisans in the printing field.

In yet another alternative process, passivation layer 20 over the gate area can be formed by changing surface properties of the substrate under UV exposure, and delivering the passivation material either uniformly or near the targeting patterning area 20 with one of coating (e.g. slot coating, dip coating, spin-coating, etc.) or printing (e.g. inkjet printing, screen printing, solution dispensing, etc.) methods known to the artisans in the field. The ink/solution then forms the pattern of area 20 under the surface force, after which the ink/solution is dried. For example, the surface is primed with an organic vapor having a hydrophobic nature, the surface is then illuminated with UV light from the substrate side as shown in FIG. 1 and the area exposed to UV light becomes hydrophilic. A layer of polystyrene film, for example, can be formed in area 20 by dipping the substrate in polystyrene solution or by coating (slot, spray coating) over the substrate. An additional air flow can be used to help the patterning when the substrate is laid horizontally.

Figure 2:
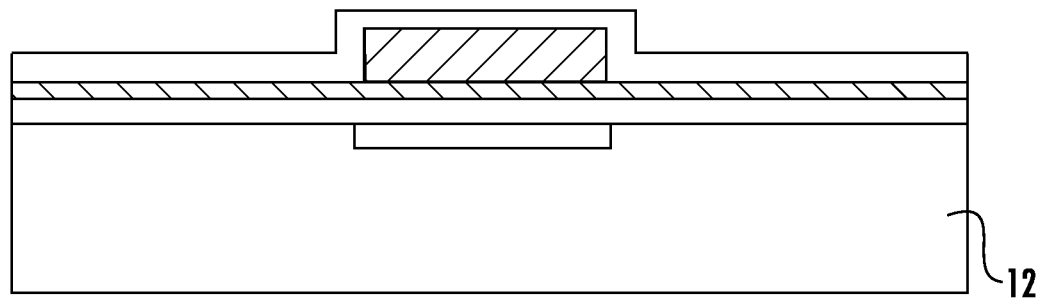
FIG. 2 illustrates a second stage or phase in the fabrication of TFTs in accordance with the present invention.
Figure 3:
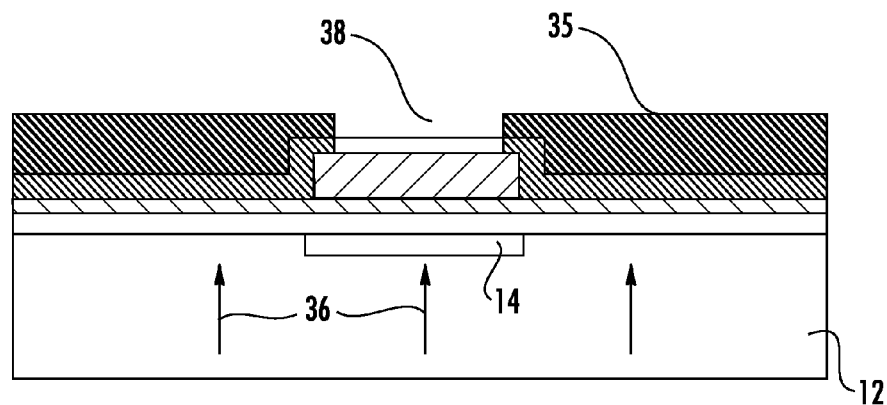
FIG. 3 illustrates a third stage or phase in the fabrication of TFTs in accordance with the present invention.

As illustrated specifically to FIG. 2, once the passivation layer is patterned or completed to produce passivation area 20, a layer of transparent conductive material, such as a transparent conductive metal oxide, a transparent thin layer of metal or metal alloys, etc. (or in some specific applications a layer of transparent organic material) is deposited on the upper surface of the device. The layer may be a blanket layer or some extra mask pattern (very rough and non-critical) may be needed to pattern other parts outside the TFT 10 area. The pattern in the non-critical outside areas can also be formed by delivering the photoresist to the corresponding area with one of the printing techniques (such as solution dispensing, inkjet printing, imprinting, off-set printing, screen printing, etc.) known to artisans in the field. As illustrated in FIG. 3, a layer of negative working photoresist, designated 35, is applied, preferably by some method such as spin coating, spray coating, slot coating, etc. (or one of the printing methods known to artisans in the field) to the upper surface of the layer of transparent conductive material.

Layer 35 of negative working photoresist is exposed from the back (below substrate 12 in FIG. 3, represented by arrows 36). Since all of the materials except gate metal 14 are transparent to the exposing light, gate metal 14 will act as a mask for the alignment of source/drain areas 22. Thus, photoresist layer 35 is exposed and developed to form a mask for the etching of the transparent conductive layer into source/drain areas 22. As illustrated in FIG. 3, a gap 38 is formed in photoresist layer 35 because the negative photoresist hardens when exposed (changes relative to the unexposed portion) and allows the unexposed areas to be removed in the developing stage.

It will be understood that the above described method of placing source/drain conductors using the negative or subtractive photoresist process can be performed in other ways. For example, another way of placing self-aligned source/drain conductors is by an additive process. In the additive process, instead of depositing a conductive layer and then patterning the layer through photolithography and an etch process to form source/drain conductors, the source/drain conductors can be selectively deposited through a photo-deposition process. In this process (hereinafter the "additive process"), the conductive material is deposited only on areas exposed to light (i.e. selective deposition). Some examples of an additive process include: Pt, Pd, Au deposition as described by Ceimig Limited; "Direct patterning ITO transparent conductive coatings", Qiang Wei et al., Chemat Technology, Inc. and conductive nanoparticles embedded in negative working photo polymer matrix, which can be patterned similar to negative resist so that only the conductive material remains in the selected locations (e.g. source/drain areas). In the latter process, in some instances it may be desirable to remove some or all of the polymer from the matrix, for example through high heat (burn-off), to increase the conductivity. It should be noted that transparency of the conductive material is optional in the additive process because of the selective deposition even though the double self-alignment process is still incorporated.

It will be understood that substantially complete control is possible for the size of overlaps d1 and d2 during the masking and etching stages without requiring additional steps or materials. For example, referring to the first masking step illustrated in FIG. 1, by changing the exposure time or intensity (e.g. increasing or decreasing either one) the amount of remaining photoresist can be decreased or increased, thus altering the width of overlap d1. Similarly, referring to the second masking step illustrated in FIG. 3, by changing the exposure time or intensity (e.g. increasing or decreasing either one) the amount of remaining photoresist can be increased or decreased, thus altering the width of overlap d2. Also, the etch used in conjunction with either of the patterns in FIGS. 1 and 3 can be increased to increase overlap d1 and/or decreased overlap d2. These features and how to adjust them are well known in the self-alignment field and are included in the term "self-align" or "self-alignment" when used to describe the process.

Throughout this disclosure methods have been set forth for the fabrication of a "Double Self-Aligned Metal Oxide TFT". The Double Self-Aligned Metal Oxide TFTs described above can be conveniently used or incorporated into a wide variety of electronic devices and circuits including thin film OLED and LCD circuits, thin film driving circuits, active matrix OLED and LCD displays, imaging array devices and thin film readout devices. At least some of these devices and circuits are disclosed in the following United States copending patent applications and patents: Amoled with Cascaded OLED Structures, Ser. No. 12/542,599, filed 17 Aug. 2009; Mask Level Reduction for MOFET, U.S. Pat. No. 8,187,929, issued 29 May 2012; Metal Oxide TFT with Improved Stability, Ser. No. 12/915,712, filed 29 Oct. 2010; Improved Active Matrix for Displays and Method of Fabrication, Ser. No. 13/006,799, filed 14 Jan. 2011; Driving Method for Improving Stability in MOTFETs, Ser. No. 13/034,458, filed 24 Feb. 2011; and Metal Oxide TFT with Improved Source/Drain Contacts, Ser. No. 13/155,749, filed 8 Jun. 2011, all of which are incorporated herein by reference. For the purpose of this disclosure, the term "Double Self-Aligned Metal Oxide TFT" is specifically defined as any structure fabricated in accordance with and coming within the scope of any of the various methods disclosed herein.

Figure 5:
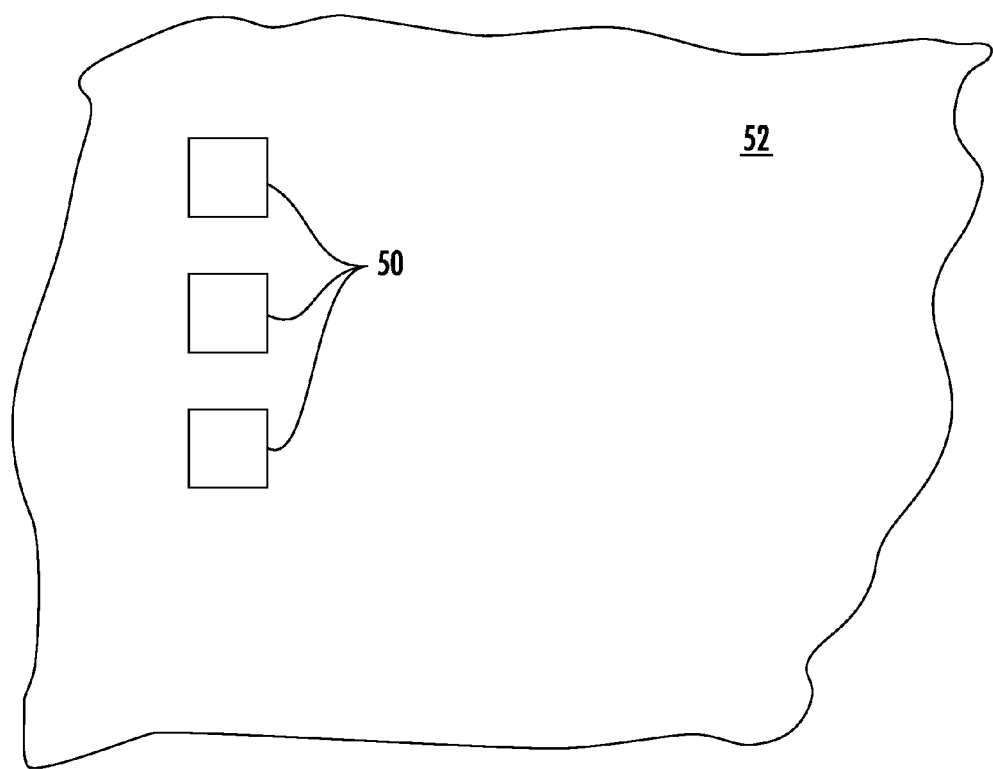
FIG. 5 illustrates a thin film electronic circuit including the double self-aligned TFTs in accordance with the present invention.

Referring specifically to FIG. 5 one or more Double Self-Aligned Metal Oxide TFTs, designated 50, are shown incorporated into electronic circuitry generally designated 52. The Double Self-Aligned Metal Oxide TFTs can be incorporated into an active matrix liquid crystal display, as a pixel driver for example. The Double Self-Aligned Metal Oxide TFTs can also be incorporated into a light emitting display in which each display pixel comprises an emissive device made of inorganic thin films or crystals, or organic electroluminescent films, or organo-metallic thin films, or their combinations, an image sensor array, a biosensor array, a pressure sensor array, a touch-panel array, or any of a variety of other devices and circuits.

The process for the source-drain layer, the gate dielectric layer and the gate layer can also be used concurrently for forming a capacitor or a contact pad in the pixel circuit and in driving circuits in peripheral areas outside the active array. They can also be used for forming buslines wiring each pixel together and connecting them to peripheral electronic circuit out side the array area.

Integrated scan drivers and data drivers can also be made with the present TFT process. The process disclosed in this invention can thus be used generally to fabricate thin-film electronic circuits, examples include backpanel circuits for active matrix liquid crystalline displays, active matrix light emitting displays with emitting element formed with either organic or inorganic light emitters, active matrix image arrays, active matrix biosensor arrays, and active addressed touch panels arrays etc.

It can be seen that no critical masking step is performed in which expensive tools are required. Also, because of the substantially complete control of the overlap or critical areas, any overlap can be provided from substantially zero to any desired amount without the necessity of sacrificing small channel lengths. Further, no expensive masks or tools are required and larger areas can be exposed during the process so that expensive stepping and stitching or the like are not required. Thus, a novel double self-alignment procedure has been disclosed for forming Double Self-Aligned Metal Oxide TFTs and additional components on transparent substrates.

The self-aligned process also reduces demands on substrate dimension stability. The process disclosed in this invention is not only suitable for rigid substrates made of glass/plastic rigid plates, but also thin glass or plastic foils in flexible or conformable forms.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A method of forming thin film electronic circuits comprising the steps of:

providing a substrate and designing the substrate with sufficient area to have fabricated thereon a selected one of a light emitting diode display, an image sensor array, a biosensor array, a pressure sensing array or a touch sensing array, the substrate having a front surface, and determining alignment and deformation tolerances of the substrate dictated by tools and process steps used during fabrication;

incorporating at least one double self-aligned metal oxide TFT into the selected one of the active matrix liquid crystal display, the light emitting diode display, the image sensor array, the biosensor array, the pressure sensing array or the touch-sensing array, and fabricating the at least one double self-aligned metal oxide TFT on the substrate comprising the steps of:

depositing opaque gate metal on the front surface of the substrate so as to define an opaque metal gate and a gate area for the TFT, depositing a gate dielectric layer overlying the substrate and the opaque metal gate and gate area, and depositing a metal oxide active layer overlying the gate dielectric layer;

forming first self-aligning passivation material in a passivation area overlying the opaque metal gate and using the passivation material defining a channel area in the metal oxide active layer, the first self-aligning passivation material including one of an inorganic or organic dielectric material comprising oxygen;

further defining an overlap area between the gate area and the first self-aligned passivation material wherein the overlap area is a portion of the gate area extending beyond horizontal limits of the passivation area on each side of the passivation area a distance equal to the alignment and deformation tolerances of the substrate, the gate area including the horizontal width of the channel area and overlap area distance on each side of the passivation area; and defining second self-aligning source/drain areas at a surface of the metal oxide active layer and positioning second self-aligned source/drain conductors therein, the second self-aligned source/drain conductors defining an overlap between each of the source/drain conductors and the first self-aligned passivation material with the width of the passivation area being larger than a distance between the overlap of the source/drain conductors.

* * * * *